(12) United States Patent
Lee et al.

(10) Patent No.: US 10,600,824 B2
(45) Date of Patent: Mar. 24, 2020

(54) DISPLAY DEVICE HAVING A SHIELDING LAYER

(71) Applicant: Samsung Display Co., Ltd., Yongin-si, Gyeonggi-do (KR)

(72) Inventors: Daewon Lee, Yongin-si (KR); Hyesong Kwun, Yongin-si (KR); Kyongtae Park, Yongin-si (KR); Donghoon Jeong, Yongin-si (KR); Kyusik Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/117,337

(22) Filed: Aug. 30, 2018

(65) Prior Publication Data

US 2019/0081090 A1   Mar. 14, 2019

(30) Foreign Application Priority Data

Sep. 8, 2017   (KR) .................. 10-2017-0115131

(51) Int. Cl.
| | |
|---|---|
| *H01L 27/12* | (2006.01) |
| *H01L 23/552* | (2006.01) |
| *H01L 27/32* | (2006.01) |
| *H01L 27/02* | (2006.01) |
| *H01L 51/00* | (2006.01) |

(52) U.S. Cl.
CPC ........ *H01L 27/1255* (2013.01); *H01L 23/552* (2013.01); *H01L 27/0288* (2013.01); *H01L 27/0296* (2013.01); *H01L 27/1218* (2013.01); *H01L 27/3272* (2013.01); *H01L 27/3244* (2013.01); *H01L 27/3276* (2013.01); *H01L 51/0097* (2013.01); *H01L 2251/5338* (2013.01)

(58) Field of Classification Search
CPC ............. H01L 27/1255; H01L 27/1218; H01L 23/552
See application file for complete search history.

(56) References Cited

U.S. PATENT DOCUMENTS

| | | | |
|---|---|---|---|
| 6,548,912 B1 | 4/2003 | Graff et al. | |
| 8,619,219 B2 * | 12/2013 | Yamazaki | ......... H01L 21/28008 349/106 |
| 9,305,984 B2 | 4/2016 | Kang | |
| 9,608,049 B2 * | 3/2017 | Lee | ...................... H01L 27/3244 |

(Continued)

FOREIGN PATENT DOCUMENTS

| | | |
|---|---|---|
| KR | 10-2010-0052174 A | 5/2010 |
| KR | 10-2015-0052645 A | 5/2015 |

(Continued)

*Primary Examiner* — Ida M Soward
(74) *Attorney, Agent, or Firm* — Lewis Roca Rothgerber Christie LLP

(57) ABSTRACT

A display device includes a flexible substrate, a buffer layer on the flexible substrate and including an inorganic material, a display area including a plurality of pixels on the buffer layer and each including a pixel circuit including a first thin film transistor (TFT), a second TFT, and a storage capacitor and a display device connected to the pixel circuit, and a non-display area that is adjacent to the display area. The flexible substrate includes at least one base layer, at least one inorganic barrier layer, and a shielding layer including a portion having a certain area and an opening adjacent to the portion.

20 Claims, 13 Drawing Sheets

(56) References Cited

U.S. PATENT DOCUMENTS

| | | | |
|---|---|---|---|
| 10,032,841 B2* | 7/2018 | Tsai | H01L 27/3276 |
| 10,199,393 B2* | 2/2019 | Yamazaki | H01L 27/1218 |
| 10,243,031 B2* | 3/2019 | Lee | H01L 27/3211 |
| 10,256,424 B2* | 4/2019 | Jang | B32B 5/145 |
| 2015/0195915 A1* | 7/2015 | Namkung | B32B 37/26 |
| | | | 361/750 |
| 2015/0255740 A1* | 9/2015 | Nakada | H01L 51/0097 |
| | | | 257/40 |
| 2016/0141348 A1* | 5/2016 | Lin | H01L 27/3262 |
| | | | 257/40 |
| 2016/0163745 A1* | 6/2016 | Choi | H01L 27/1251 |
| | | | 257/40 |
| 2017/0069615 A1 | 3/2017 | Sagong et al. | |
| 2017/0077213 A1* | 3/2017 | Jo | H01L 27/3276 |
| 2017/0092709 A1 | 3/2017 | Choi et al. | |
| 2017/0352834 A1* | 12/2017 | Kim | H01L 27/3276 |
| 2018/0366518 A1* | 12/2018 | Lin | H01L 27/283 |
| 2019/0013378 A1* | 1/2019 | Wang | H01L 27/3276 |

FOREIGN PATENT DOCUMENTS

| | | |
|---|---|---|
| KR | 10-2017-0029799 A | 3/2017 |
| KR | 10-2017-0037786 A | 4/2017 |

* cited by examiner

DISPLAY DEVICE HAVING A SHIELDING LAYER

CROSS-REFERENCE TO RELATED APPLICATION

This application claims priority to and the benefit of Korean Patent Application No. 10-2017-0115131, filed on Sep. 8, 2017, in the Korean Intellectual Property Office, the disclosure of which is incorporated herein in its entirety by reference.

BACKGROUND

1. Field

One or more embodiments relate to a display device.

2. Description of the Related Art

Applications of display devices have diversified. Also, due to their relatively small thickness and light weight, the application range thereof has increased. As display devices are variously utilized, various designs of the display devices have been studied.

The above information disclosed in this Background section is only for enhancement of understanding of the background and therefore it may contain information that does not constitute prior art.

SUMMARY

One or more embodiments include a display device including a flexible substrate.

Additional aspects will be set forth in part in the description which follows and, in part, will be apparent from the description, or may be learned by practice of the presented embodiments.

According to one or more embodiments, a display device includes: a flexible substrate; a buffer layer on the flexible substrate and including an inorganic material; a display area including a plurality of pixels, wherein each pixel includes a pixel circuit on the buffer layer and a display element connected to the pixel circuit, and the pixel circuit includes a first thin film transistor (TFT), a second TFT, and a storage capacitor; and a non-display area adjacent to the display area, wherein the flexible substrate includes: at least one base layer; at least one inorganic barrier layer; and a shielding layer including a portion having a certain area and an opening adjacent to the portion.

The portion of the shielding layer may overlap the first TFT, and the opening of the shielding layer may overlap the second TFT.

The portion of the shielding layer may correspond to the non-display area, and the opening of the shielding layer may correspond to the display area.

The at least one base layer and the at least one inorganic barrier layer may directly contact each other via the opening of the shielding layer.

The flexible substrate may include: a first base layer; a second base layer on the first base layer; an inorganic barrier layer between the first base layer and the second base layer; and the shielding layer.

The first base layer may include an upper surface that faces the inorganic barrier layer, and a lower surface opposite to the upper surface, and the shielding layer may be on at least one of the upper surface or the lower surface of the first base layer.

The shielding layer may be between the first base layer and the inorganic barrier layer, and the inorganic barrier layer and the first base layer may directly contact each other via the opening of the shielding layer.

The second base layer may include a lower surface that faces the inorganic barrier layer, and an upper surface opposite to the lower surface, and the shielding layer may be on at least one of the upper surface or the lower surface of the second base layer.

The shielding layer may be between the second base layer and the inorganic barrier layer, and the inorganic barrier layer and the second base layer may directly contact each other via the opening of the shielding layer.

The shielding layer may include amorphous silicon doped with P-type or N-type impurity or hydrogenated amorphous silicon.

The shielding layer may include a transparent conductive material.

According to one or more embodiments, a display device includes: a flexible substrate; a buffer layer on the flexible substrate and including an inorganic material; and a plurality of pixels on the buffer layer, wherein each pixel includes a pixel circuit including a first thin film transistor (TFT), a second TFT, and a storage capacitor and a display element connected to the pixel circuit, wherein the flexible substrate includes: at least one base layer; at least one inorganic barrier layer; and a shielding layer, wherein the shielding layer includes a portion corresponding to the first TFT and having a certain area, and an opening adjacent to the portion.

The opening of the shielding layer may correspond to the second TFT.

The storage capacitor may overlap the first TFT and a portion of the shielding layer.

The at least one base layer and the at least one inorganic barrier layer may directly contact each other via the opening of the shielding layer.

The shielding layer may include a semiconductor material or a transparent conductive material.

The portion of the shielding layer may include: first portions that cover respective first TFTs of the plurality of pixels; and second portions that connect the first portions to each other.

The second portions may each extend in a first direction and connect the first portions to each other, and the opening of the shielding layer may have a stripe pattern extending in the first direction.

The second portions may each extend in a first direction and a second direction intersecting with the first direction and connect the first portions to each other, and the shielding layer may have a net pattern in which the opening is surrounded by the first and second portions.

The shielding layer may further include an additional shielding portion corresponding to an outer area of the substrate such as to at least partially surround the plurality of pixels.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
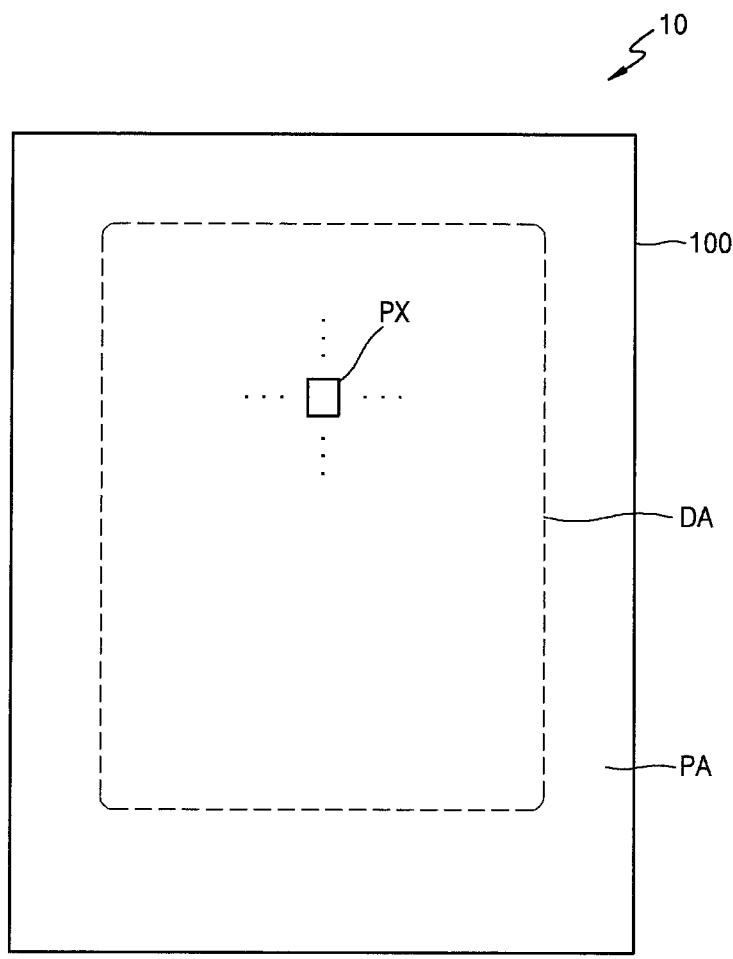
FIG. 1 is a schematic plan view of a display device according to some exemplary embodiments.

As the invention allows for various changes and numerous embodiments, some exemplary embodiments will be illustrated in the drawings and described in more detail in the written description. Hereinafter, aspects and features of the present invention and a method for accomplishing them will be described more fully with reference to the accompanying drawings, in which some exemplary embodiments of the invention are shown. This invention may, however, be embodied in many different forms and should not be construed as limited to the embodiments set forth herein.

One or more embodiments of the invention will be described below in more detail with reference to the accompanying drawings. Those components that are the same or are in correspondence are rendered the same reference numeral regardless of the figure number, and redundant explanations are omitted.

It will be understood that although the terms "the first", "the second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

In the drawings, the thicknesses of layers and regions are exaggerated or minimized for convenience of explanation.

In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or component or intervening layers, regions, or components may be present. It will also be understood that when a layer, region, or component is referred to as being "electrically connected" or "electrically coupled" to another layer, region, or component, it can be directly electrically connected or coupled to the other layer, region, or component or intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Display devices display image. Examples of display devices include liquid crystal displays (LCDs), electrophoretic displays, organic light-emitting displays, inorganic light-emitting displays, field emission displays, surface-conduction electron-emitter displays, plasma displays, and cathode ray displays.

Although an organic light-emitting display device will now be illustrated and described as a display device according to an embodiment of the present invention, embodiments are not limited thereto, and various types of display devices may be used.

FIG. 1 is a schematic plan view of a display device 10 according to some exemplary embodiments. Referring to FIG. 1, the display device 10 includes a substrate 100. The substrate 100 has a display area DA and a peripheral area PA adjacent to the display area DA. The peripheral area PA may surround the display area DA (e.g., outside a footprint of the display area DA).

A plurality of pixels PX may be arranged on or at (e.g., within) the display area DA. Each pixel PX may include a pixel circuit including a thin film transistor (TFT) and a storage capacitor which are electrically connected to a signal line and/or a power line, and the like, and a display element connected to the pixel circuit. The display element may be for example, an organic light-emitting diode (OLED). The pixel PX may emit, for example, red light, green light, blue light, or white light by the OLED. The pixel PX used herein may be understood as a pixel that emits one of red light, green light, blue light, and white light as described above. Although not shown in the drawings, the display area DA may be covered with an encapsulation layer and thus may be protected from ambient air, moisture, or the like. When a display device included in the pixel PX is an OLED, at least a driving TFT and a switching TFT may be included. Depending on a design of the pixel PX, additional TFTs may be further included in addition to the two TFTs.

On the peripheral area PA of the substrate 100, various lines for transmitting electrical signals to be applied to the display area DA, a scan driver, and a data driver may be positioned. The peripheral area PA is a non-display area.

Figure 2:
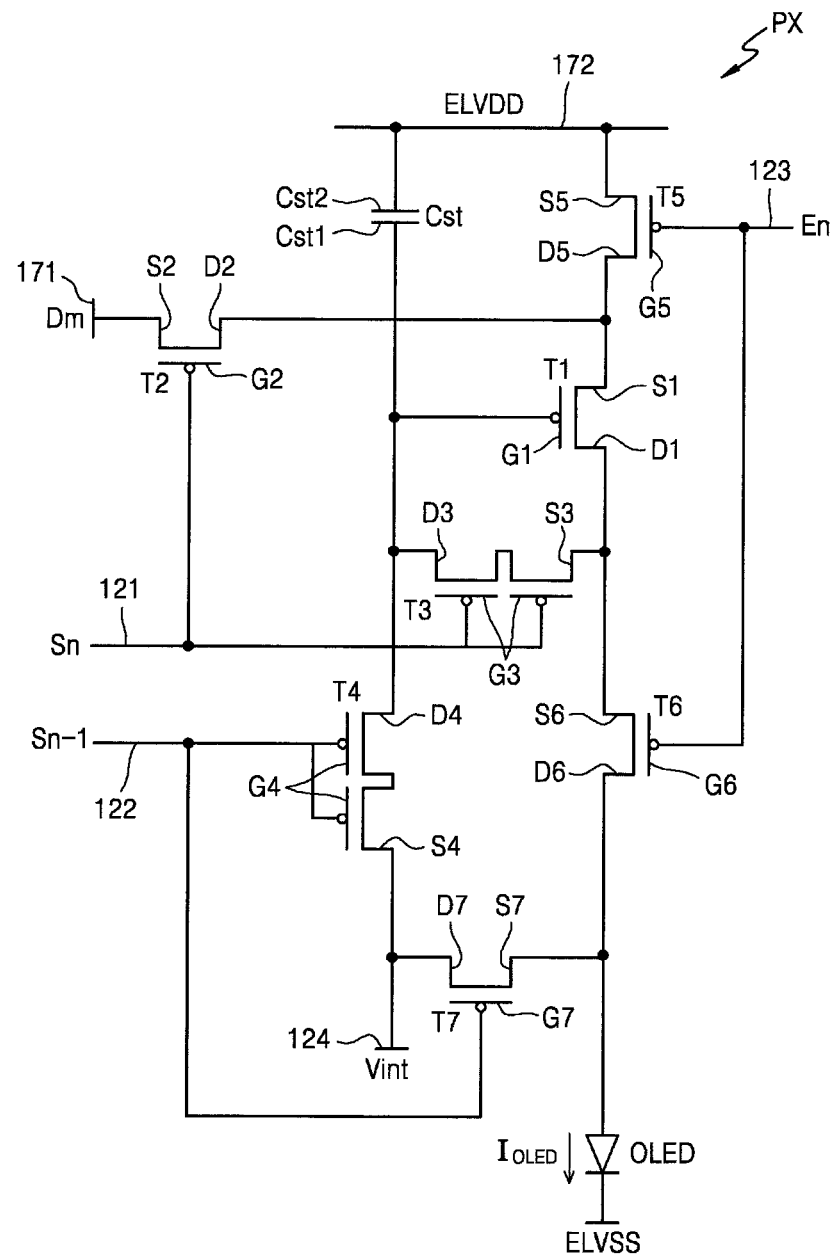
FIG. 2 is an equivalent circuit diagram of a pixel of a display device according to some exemplary embodiments.

FIG. 2 is an equivalent circuit diagram of a pixel of a display device according to some exemplary embodiments. Referring to FIG. 2, the pixel PX may include signal lines, a plurality of TFTs connected to the signal lines, a storage capacitor Cst, an initializing voltage line 124, a driving voltage line 172, and an OLED.

The plurality of TFTs may include a first TFT T1, a second TFT T2, a third TFT T3, a fourth TFT T4, a fifth TFT T5, a sixth TFT T6, and a seventh TFT T7.

The signal lines may include a scan line 121 that transmits a scan signal Sn, a previous scan line 122 that transmits a previous scan signal Sn−1 to the fourth TFT T4 and the seventh TFT T7, a light-emission control line 123 that transmits a control signal En to the fifth TFT T5 and the sixth TFT T6, and a data line 171 that intersects with the scan line 121 and transmits a data signal Dm. The driving voltage line 172 transmits a driving voltage ELVDD to the first TFT T1, and the initializing voltage line 124 transmits an initializing voltage Vint that initializes the first TFT T1 and a pixel electrode of the OLED.

The first TFT T1 is a driving TFT, and includes a driving gate electrode G1 connected to a first storage capacitor plate Cst1 of the storage capacitor Cst, a driving source electrode S1 connected to the driving voltage line 172 via the fifth TFT T5, and a driving drain electrode D1 electrically connected to the pixel electrode of the OLED via the sixth TFT T6. The first TFT T1 receives the data signal Dm based on a switching operation of the second TFT T2 and supplies a driving current $I_{OLED}$ to the OLED.

The second TFT T2 is a switching TFT, and includes a switching gate electrode G2 connected to the scan line 121, a switching source electrode S2 connected to the data line 171, and a switching drain electrode D2 connected to the driving source electrode S1 of the first TFT T1 and also connected to the driving voltage line 172 via the fifth TFT T5. The second TFT T2 is turned on based on the scan signal Sn received via the scan line 121 and performs a switching operation of transmitting the data signal Dm received from the data line 171 to the driving source electrode S1 of the first TFT T1.

The third TFT T3 is a compensating TFT, and includes a compensating gate electrode G3 connected to the scan line 121, a compensating source electrode S3 connected to the driving drain electrode D1 of the first TFT T1 and also connected to the pixel electrode of the OLED via the sixth TFT T6, and a compensating drain electrode D3 connected to the first storage capacitor plate Cst1 of the storage capacitor Cst, a first initializing drain electrode D4 of the fourth TFT T4, and the driving gate electrode G1 of the first TFT T1. The third TFT T3 is turned on based on the scan signal Sn received via the scan line 121 and electrically connects the driving gate electrode S1 and the driving drain electrode D1 of the first TFT T1 to each other, such that the first TFT T1 is diode-connected.

The fourth TFT T4 is a first initializing TFT, and includes a first initializing gate electrode G4 connected to the previous scan line 122, a first initializing source electrode S4 connected to a second initializing drain electrode D7 of the seventh TFT T7 and the initializing voltage line 124, and the first initializing drain electrode D4 connected to the first storage capacitor plate Cst1 of the storage capacitor Cst, the compensating drain electrode D3 of the third TFT T3, and the driving gate electrode G1 of the first TFT T1. The fourth TFT T4 is turned on based on the previous scan signal Sn−1 received via the previous scan line 122 and transmits the initializing voltage Vint to the driving gate electrode G1 of the first TFT T1 to thereby initialize a voltage of the driving gate electrode G1 of the first TFT T1.

The fifth TFT T5 is an operation control TFT, and includes an operation control gate electrode G5 connected to the light-emission control line 123, an operation control source electrode S5 connected to the driving voltage line 172, and an operation control drain electrode D5 connected to the driving source electrode S1 of the first TFT T1 and the switching drain electrode D2 of the second TFT T2.

The sixth TFT T6 is a light-emission control TFT, and includes a light-emission control gate electrode G6 connected to the light-emission control line 123, a light-emission control source electrode S6 connected to the driving drain electrode D1 of the first TFT T1 and the compensating source electrode S3 of the third TFT T3, and a light-emission control drain electrode D6 electrically connected to a second initializing source electrode S7 of the seventh TFT T7 and the pixel electrode of the OLED.

The fifth TFT T5 and the sixth TFT T6 are simultaneously (e.g., concurrently) turned on according to the control signal En received via the light-emission control line 123, and thus the driving voltage ELVDD is transmitted to the OLED such that the driving current $I_{OLED}$ may flow in the OLED.

The seventh TFT T7 is a second initializing TFT, and includes a second initializing gate electrode G7 connected to the previous scan line 122, a second initializing source electrode S7 connected to the light-emission control drain electrode D6 of the sixth TFT T6 and the pixel electrode of the OLED, and a second initializing drain electrode D7 connected to the first initializing source electrode S4 of the fourth TFT T4 and the initializing voltage line 124. The seventh TFT T7 is turned on based on the previous scan signal Sn−1 received via the previous scan line 122 and initializes the pixel electrode of the OLED.

A more detailed operation of each pixel PX according to some exemplary embodiments will now be described. During an initializing period, when the previous scan signal Sn−1 is supplied via the previous scan line 122, the fourth TFT T4 is turned on in response to the previous scan signal Sn−1, and the first TFT T1 is initialized by the initializing voltage Vint supplied from the initializing voltage line 124.

During a data programming period, when the scan signal Sn is supplied via the scan line 121, the second TFT T2 and the third TFT T3 are turned on in response to the scan signal Sn. At this time, the first TFT T1 is diode-connected by the turned-on third TFT T3 and is biased in a forward direction.

Then, a compensating voltage Dm+Vth (where Vth has a negative value) obtained by subtracting a threshold voltage Vth of the first TFT T1 from the data signal Dm supplied from the data line 171 is applied to the driving gate electrode G1 of the first TFT T1.

The driving voltage ELVDD and the compensating voltage Dm+Vth are applied to both ends of the storage capacitor Cst, and a charge corresponding to a voltage difference between both ends is stored in the storage capacitor Cst.

During a light-emission period, the fifth TFT T5 and the sixth TFT T6 are turned on according to the control signal En supplied from the light-emission control line 123. The driving current $I_{OLED}$ according to a voltage difference between a voltage of the driving gate electrode G1 of the first TFT T1 and the driving voltage ELVDD is generated and is supplied to the OLED via the sixth TFT T6.

Although the fourth TFT T4 and the seventh TFT T7 are connected to the previous scan line 122 in FIG. 2, embodiments are not limited thereto. According to another embodiment, the fourth TFT T4 may be connected to the previous scan line 122 and operate according to the previous scan signal Sn−1, and the seventh TFT T7 may be connected to a separate signal line (for example, a subsequent scan line) and operate according to a signal received from the separate signal line.

A second storage capacitor plate Cst2 of the storage capacitor Cst is connected to the driving voltage line 172, and an opposite electrode of the OLED is connected to a common voltage ELVSS. Accordingly, the OLED may receive the driving current $I_{OLED}$ from the first TFT T1 and emits light, thereby displaying an image.

Although each of the third TFT T3 and the fourth TFT T4 has a dual gate electrode in FIG. 2, embodiments are not limited thereto. For example, each of the third TFT T3 and the fourth TFT T4 may have a single gate electrode. Alternatively, at least one of TFTs T1, T2, T5, T6, or T7 other than the third TFT T3 and the fourth TFT T4 may have a dual gate electrode. In this way, various modifications may be made.

Although each pixel PX includes the signal lines 121, 122, 123, and 171, the initializing voltage line 124, and the driving voltage line 172 in FIG. 2, embodiments are not limited thereto. According to another embodiment, at least one of the signal lines 121, 122, 123, or 171, or/and the initializing voltage line 124 may be shared by neighboring pixels.

Although a single pixel PX includes seven transistors in FIG. 2, embodiments are not limited thereto. According to another embodiment, when the single pixel PX includes the first TFT T1, the second TFT T2, and the storage capacitor Cst, the number of TFTs other than the first and second TFTs T1 and T2 and a circuit connection may vary. For convenience of explanation, a case where each pixel PX includes seven TFTs will now be described.

Figure 3:
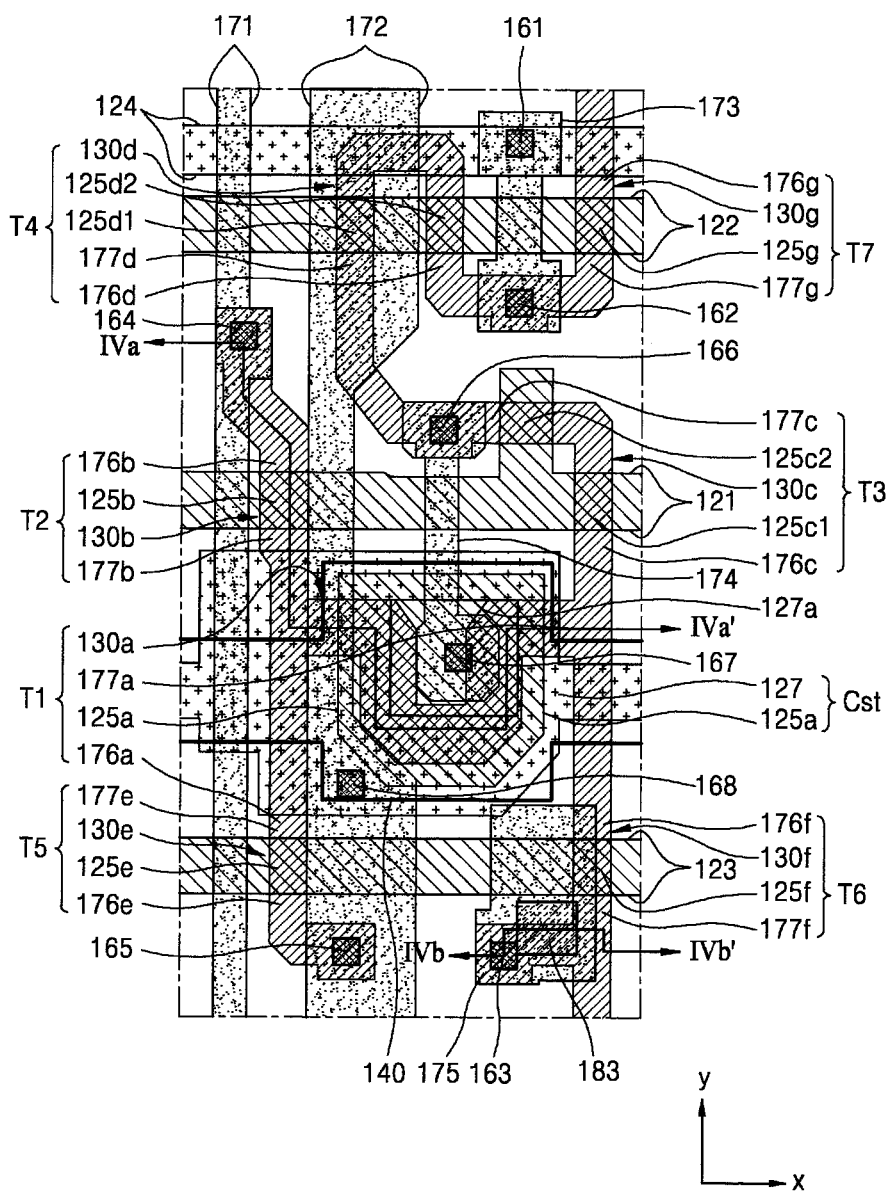
FIG. 3 is a schematic plan diagram illustrating locations of thin film transistors (TFTs) and a storage capacitor of a pixel according to some exemplary embodiments.
Figure 4:
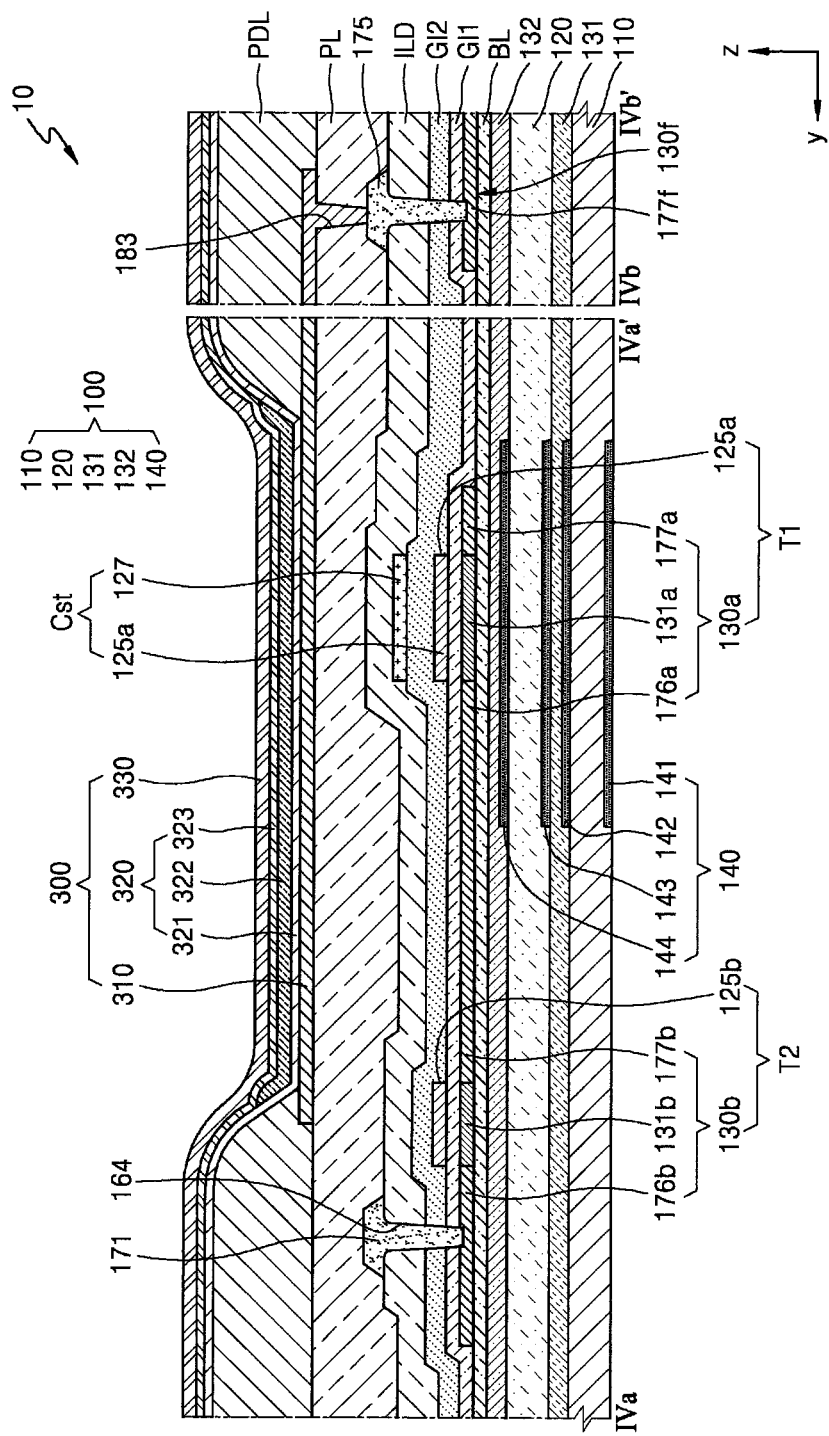
FIG. 4 is a cross-sectional view taken along lines IVa-Iva' and IVb-IVb' of FIG. 3.

FIG. 3 is a schematic layout diagram illustrating locations of TFTs and a storage capacitor of a pixel according to an embodiment, and FIG. 4 is a cross-sectional view taken along lines IVa-Iva' and IVb-IVb' of FIG. 3.

Referring to FIG. 3, a pixel PX includes a scan line 121, a previous scan line 122, a light-emission control line 123, and an initializing voltage line 124 respectively applying a scan signal Sn, a previous scan signal Sn−1, a control signal En, and an initializing voltage Vint and each extending in a row direction (x direction or first direction). The pixel PX may also include a data line 171 and a driving voltage line 172 respectively applying a data signal Dm and a driving voltage ELVDD. The data line 171 and the driving voltage line 172 may extend in a column direction (a y direction or second direction) crossing the row direction.

As described above with reference to FIG. 2, the pixel PX may include first through seventh TFTs T1, T2, T3, T4, T5, T6, and T7, a storage capacitor Cst, and an OLED 300 of FIG. 4 electrically connected to the first through seventh TFTs T1, T2, T3, T4, T5, T6, and T7 and the storage capacitor Cst.

The first TFT T1, the second TFT T2, the third TFT T3, the fourth TFT T4, the fifth TFT T5, the sixth TFT T6, and the seventh TFT T7 may be formed along a semiconductor layer. The semiconductor layer may be bent in any of various shapes. Referring to FIG. 4, the semiconductor layer is arranged (disposed) on a buffer layer BL of a substrate 100.

The semiconductor layer may include a driving semiconductor layer 130a of the first TFT T1, a switching semiconductor layer 130b of the second TFT T2, a compensating semiconductor layer 130c of the third TFT T3, a first initializing semiconductor layer 130d of the fourth TFT T4, an operation control semiconductor layer 130e of the fifth TFT T5, a light-emission control semiconductor layer 130f of the sixth TFT T6, and a second initializing semiconductor layer 130g of the seventh TFT T7, which may be connected to each other.

The semiconductor layer may include poly-silicon (polycrystalline silicon). Alternatively, the semiconductor layer may include amorphous silicon, oxide semiconductor, or an organic semiconductor material. The semiconductor layer may include a channel region, and a source region and a drain region on both sides of the channel region. The channel region may be a region of the semiconductor layer overlapping the scan line 121, the previous scan line 122, the light-emission control line 123, or a driving gate electrode 125a. The source region and the drain region may be doped with impurities by using the scan line 121, the previous scan line 122, the light-emission control line 123, and the driving gate electrode 125a as self-alignment masks. The impurities may vary depending on the type of TFT. The impurities may include N-type impurities or P-type impurities. The source region and the drain region correspond to a source electrode and a drain electrode of a TFT. Hereinafter, a source region or a drain region is used instead of a source electrode or a drain electrode.

The first TFT T1 includes the driving semiconductor layer 130a and the driving gate electrode 125a. The driving semiconductor layer 130a includes impurity-doped driving source and drain regions 176a and 177a and a driving channel region 131a (see FIG. 4) therebetween. The driving channel region 131a is a portion of the driving semiconductor layer 130a that is overlapped by the driving gate electrode 125a. The driving channel region 131a may have a curved shape and thus have a long channel length. Although the driving channel region 131a has a curved shape of an Omega shape in FIG. 3, embodiments are not limited thereto. According to another embodiment, the driving channel region 131a may have any of various curved shapes, such as an S shape.

The driving gate electrode 125a may function as a gate electrode of the first TFT T1 and may also function as a first storage capacitor plate of the storage capacitor Cst, which will be described below. A first gate insulating layer GI1 is between the driving semiconductor layer 130a and the driving gate electrode 125a. The first gate insulating layer GI1 may include an inorganic insulating material, such as silicon oxide (SiOx), silicon nitride (SiNx), or silicon oxynitride (SiON). The driving source region 176a may be connected to a switching drain region 177b and an operation control drain region 177e, which will be described below, and the driving drain region 177a may be connected to a compensating source region 176c and a light-emission control source region 176f, which will be described in more detail below.

The second TFT T2 includes the switching semiconductor layer 130b and a switching gate electrode 125b. The switching semiconductor layer 130b includes impurity-doped switching source and drain regions 176b and 177b and a switching channel region 131b (see FIG. 4) therebetween. The switching channel region 131b is a portion of the switching semiconductor layer 130b that is overlapped by the switching gate electrode 125b, and the switching gate electrode 125b corresponds to a portion of the scan line 121.

One of the switching source region 176b and the switching drain region 177b may be connected to the data line 171, and the other one may be connected to the first TFT T1 and the fifth TFT T5. For example, the switching source region 176b may be electrically connected to the data line 171 via a contact hole 164 of an interlayer insulating layer ILD. FIG. 4 shows that the contact hole 164 passes through the interlayer insulating layer ILD, a second gate insulating layer GI2, and the first gate insulating layer GI1. The second gate insulating layer GI2 and the interlayer insulating layer ILD may include an inorganic insulating material, such as silicon oxide (SiOx), silicon nitride (SiNx), or silicon oxynitride (SiON). The switching drain region 177b may be connected to the first TFT T1 and the fifth TFT T5.

The third TFT T3 includes the compensating semiconductor layer 130c and compensating gate electrodes 125c1 and 125c2. The compensating semiconductor layer 130c includes impurity-doped compensating source and drain regions 176c and 177c and a compensating channel region therebetween. The compensating channel region is a portion of the compensating semiconductor layer 130c that is overlapped by the compensating gate electrodes 125c1 and 125c2. The compensating gate electrodes 125c1 and 125c2 correspond to a portion of the scan line 121. The compensating gate electrodes 125c1 and 125c2 correspond to a dual gate electrode including a first gate electrode 125c1 and a second gate electrode 125c2, and may prevent or reduce generation of a leakage current. The compensating drain region 177c may be connected to a first storage capacitor plate 125a of the storage capacitor Cst via a node connecting line 174.

The node connecting line 174 may include the same material as the data line 171 and may be disposed on the same layer as a layer on which the data line 171 is disposed. A first end portion of the node connecting line 174 is connected to the compensating drain region 177c and a first initializing drain region 177d via a contact hole 166 formed in the first and second gate insulating layers GI1 and GI2 and the interlayer insulating layer ILD. A second end portion of the node connecting line 174 is connected to the first storage capacitor plate 125a via a contact hole 167 formed in the second gate insulating layer GI2 and the interlayer insulating layer ILD. The second end of the node connecting line 174 may be connected to the first storage capacitor plate 125a via a storage opening 127a formed in a second storage capacitor plate 127 of the storage capacitor Cst.

The fourth TFT T4 includes the first initializing semiconductor layer 130d and a first initializing gate electrode 125d. The first initializing semiconductor layer 130d includes first initializing source and drain regions 176d and 177d doped with impurities and a first initializing channel region therebetween. The first initializing channel region is a portion of the first initializing semiconductor layer 130d that is overlapped by the first initializing gate electrode 125d, and the first initializing gate electrode 125d corresponds to a portion of the previous scan line 122.

One of the first initializing source region 176d and the first initializing drain region 177d may be connected to the initializing voltage line 124, and the other one may be connected to the first TFT T1. For example, the first initializing source region 176d is connected to the initializing voltage line 124 via an initializing connection line 173. The initializing voltage line 124 may include the same material as the second storage capacitor plate 127 which will be described below. The initializing voltage line 124 may be disposed on the same layer as a layer on which the second storage capacitor plate 127 is disposed. One end of the initializing connecting line 173 may be connected to the initializing voltage line 124 via a contact hole 161 formed in the second gate insulating layer GI2 and the interlayer insulating layer ILD, and the other end of the initializing connecting line 173 may be connected to the first initializing source region 176d via a contact hole 162 formed in the second gate insulating layer G12 and the interlayer insulating layer ILD.

The fifth TFT T5 includes the operation control semiconductor layer 130e and an operation control gate electrode 125e. The operation control semiconductor layer 130e includes operation control source and drain regions 176e and 177e doped with impurities and an operation control channel region therebetween. The operation control channel region is a portion of the operation control semiconductor layer 130e that is overlapped by the operation control gate electrode 125e. The operation control gate electrode 125e corresponds to a portion of the light-emission control line 123.

One of the operation control source region 176e and the operation control drain region 177e may be connected to the driving voltage line 172, and the other one may be connected to the first TFT T1. For example, the operation control source region 176e may be electrically connected to the driving voltage line 172 via a contact hole 165 formed in the first and second gate insulating layers GI1 and GI2 and the interlayer insulating layer ILD. As necessary, a portion of the driving voltage line 172, for example, a portion of the driving voltage line 172 around the contact hole 165, may be understood as a source region of the fifth TFT T5, namely, a source electrode thereof.

The sixth TFT T6 includes the light-emission control semiconductor layer 130f and a light-emission control gate electrode 125f. The light-emission control semiconductor layer 130f includes light-emission control source and drain regions 176f and 177f doped with impurities and a light-emission control channel region therebetween. The light-emission control channel region is a portion of the light-emission control semiconductor layer 130f that is overlapped by the light-emission control gate electrode 125f. The light-emission control gate electrode 125f corresponds to a portion of the light-emission control line 123.

One of the light-emission control source region 176f and the light-emission control drain region 177f may be connected to the first TFT T1, and the other one may be connected to the seventh TFT T7 and a pixel electrode 310. For example, the light-emission control drain region 177f may be connected to a conductive layer 175 disposed on the interlayer insulating layer ILD. The conductive layer 175 may connected to the light-emission control drain region 177f via a contact hole 163. FIG. 4 shows that the contact hole 163 passes through the first and second gate insulating layers GI1 and GI2, and the interlayer insulating layer ILD. The conductive layer 175 may be understood as a drain region of the sixth TFT T6, namely, a drain electrode thereof. The conductive layer 175 may be disposed on the same layer as a layer on which the data line 171 is disposed, and may include the same material as a material used to form the data line 171. The conductive layer 175 is electrically connected to the pixel electrode 310 of the OLED 300 via a contact hole 183.

The seventh TFT T7 includes the second initializing semiconductor layer 130g and a second initializing gate electrode 125g. The second initializing semiconductor layer 130g includes second initializing source and drain regions 176g and 177g doped with impurities and a second initializing channel region therebetween. The second initializing channel region is a portion of the second initializing semiconductor layer 130g that is overlapped by the second initializing gate electrode 125g, and the second initializing gate electrode 125g corresponds to a portion of the previous scan line 122.

One of the second initializing source region 176g and the second initializing source region 177g is connected to the sixth TFT T6 and the pixel electrode 310, and the other end is connected to the initializing voltage line 124. For example, the second initializing source region 176g is connected to the light-emission control drain region 177f of the sixth TFT T6 and the pixel electrode 310 of the OLED 300, and the second initializing drain region 177g is connected to the first initializing source region 176d of the fourth TFT T4 and the initializing voltage line 124. The seventh TFT T7 may be turned on according to a previous scan signal received via the previous scan line 122 and initialize the pixel electrode 310 of the OLED 300.

The storage capacitor Cst includes the first storage capacitor plate 125a and the second storage capacitor plate 127. The second storage capacitor plate 127 may overlap the first storage capacitor plate 125a with the second gate insulating layer GI2 therebetween. By designing the storage capacitor Cst and the first TFT T1 such that they overlap each other, the first storage capacitor plate 125a and the second storage capacitor plate 127 may have sufficient areas even when the size of each pixel PX decreases due to a high resolution, and thus a high-quality image may be provided. The second storage capacitor plate 127 may be electrically connected to the driving voltage line 172 via a contact hole 168.

The pixel electrode 310 is disposed on a planarization insulating layer PL. The planarization insulating layer PL may cover the data line 171, the driving voltage line 172, the initializing connection line 173, the node connecting line 174, and the conductive layer 175. The planarization insulating layer PL may include an organic insulation material. The organic insulation material may include, but is not limited to, an imide-based polymer, a commercial polymer (such as, polymethyl methacrylate (PMMA) or polystyrene (PS)), a polymer derivative having a phenol-based group, an acryl-based polymer, an aryl ether-based polymer, an amide-based polymer, a fluorine-based polymer, a p-xylene-based polymer, a vinyl alcohol-based polymer, a blend thereof, or the like.

A pixel definition layer PDL may be disposed on the pixel electrode 310. The pixel defining layer PDL defines pixels by including respective openings corresponding to pixels, namely, an opening via which at least a center portion of the pixel electrode 310 is exposed. The pixel defining layer PDL may prevent or reduce instances of an arc or the like from occurring between an edge of the pixel electrode 310 and an opposite electrode 330 of the OLED 300, by increasing a distance between the edge of the pixel electrode 310 and the opposite electrode 330. The pixel definition layer PDL may be formed of an organic material, for example, polyimide or hexamethyldisiloxane (HMDSO).

An intermediate layer 320 of the OLED 300 may include an emission layer 322 and first and second functional layers 321 and 323 respectively disposed below and on the emission layer 322. The first functional layer 321 may include a hole injection layer (HIL), and a hole transport layer (HTL), and the second functional layer 323 may include an electron transport layer (ETL) and/or an electron injection layer (EIL).

The intermediate layer 320 may include a low-molecular weight or high-molecular weight material. When the intermediate layer 320 includes a low-molecular weight material, the intermediate layer 320 may have a structure in which an HIL, an HTL, an EML, an ETL, and an EIL are stacked in a single or complex structure, and may include various organic materials including copper phthalocyanine (CuPc), N,N'-Di(naphthalene-1-yl)-N,N'-diphenyl-benzidine (NPB), and tris-8-hydroxyquinoline aluminum (Alq3). These layers may be formed via deposition.

When the intermediate layer 320 includes a high-molecular material, the intermediate layer 320 may generally include an HTL and an EML. In this case, the HTL may include poly(ethylenedioxythiophene) (PEDOT), and the EML may include a high-molecular weight material, such as a polyphenylene vinylene (PPV)-based material or a polyfluorene-based material. The intermediate layer 320 is not limited to the above-described structure, and may have any of various other structures. For example, the intermediate layer 320 may include layer(s) that cover(s) a plurality of pixel electrodes 310 or may include patterned layer(s) respectively corresponding to the plurality of pixel electrodes 310.

The opposite electrode 330 may be disposed on the intermediate layer 320. The opposite electrode 330 may be formed as a single body constituting a plurality of OLEDs 300, and thus may correspond to the plurality of pixel electrodes 310.

Although not shown in the drawings, a thin film encapsulation layer may be further disposed on the opposite electrode 330. The thin film encapsulation layer may include at least one organic encapsulation layer and at least one inorganic encapsulation layer, and an electrode layer including a touch electrode, a polarization plate or a color filter for reducing reflection of external light, and a black matrix optical functional layer may be disposed on the thin film encapsulation layer.

A pixel circuit including the first through seventh TFTs T1, T2, T3, T4, T5, T6, and T7 and the storage capacitor Cst, and a display device electrically connected to the pixel circuit are disposed on a substrate 100 having flexibility.

The substrate 100, which is a flexible substrate, includes at least one base layer, at least one inorganic barrier layer, and a shielding layer 140. FIG. 4 illustrates the substrate 100 including a first base layer 110, a second base layer 120, a first inorganic barrier layer 131 between the first and second base layers 110 and 120, a second inorganic barrier layer 132 positioned on the side of the second base layer 120 opposite to the first inorganic barrier layer 131, and the shielding layer 140.

The first and second base layers 110 and 120 may include an organic material such as a polymer. For example, the first and second base layers 110 and 120 may include polyimide (PI), polyethersulphone (PES), polyacrylate (PAR), polyetherimide (PEI), polyethyelenen napthalate (PEN), polyethyeleneterepthalate (PET), polyphenylene sulfide (PPS), polyallylate, polycarbonate (PC), cellulose triacetate (TAC), cellulose acetate propionate (CAP), cyclic olefin polymer, cyclic olefin copolymer, or the like.

The first and second base layers 110 and 120 have certain thicknesses and are flexible. The first and second base layers 110 and 120 may have thicknesses in a range of 3 (or about 3) µm to 50 (or about 50) µm. According to an embodiment, the first and second base layers 110 and 120 may have thicknesses in a range of 3 (or about 3) µm to 20 (or about) µm. According to another embodiment, the first and second base layers 110 and 120 may have thicknesses in a range of 5 (or about 5) µm to 10 (or about 10) µm. Thicknesses of the first and second base layers 110 and 120 may be the same as each other or different from each other.

The first and second inorganic barrier layers 131 and 132 may prevent or reduce instances external foreign materials, such as moisture, from permeating the display device 10 via the substrate 100. Each of the first and second inorganic barrier layers 131 and 132 may be a single layer or multiple layers including an inorganic material, such as SiNx and/or SiOx. According to an embodiment, each of the first and second inorganic barrier layers 131 and 132 may be an SiOx layer having a thickness of about 5000 Å to about 6000 Å.

The shielding layer 140 may be disposed on the at least one organic barrier layer and/or the at least one inorganic barrier layer. FIG. 4 shows that the shielding layer 140 includes first through fourth shielding layers 141, 142, 143, and 144. However, embodiments of the present invention are not limited thereto. According to another embodiment, the shielding layer 140 may include at least one layer selected from the first through fourth shielding layers 141, 142, 143, and 144. For example, the shielding layer 140 may include only one layer from among the first through fourth shielding layers 141, 142, 143, and 144 or may include two or three layers from among the first through fourth shielding layers 141, 142, 143, and 144. When the shielding layer 140 includes only some of the first through fourth shielding layers 141, 142, 143, and 144, it is better to select one or more layers which are disposed farther from the driving semiconductor layer 130a in a z direction (a thickness direction of a substrate) so as to minimize an influence of an electrostatic discharge upon the semiconductor layers. For example, the substrate 100 may include at least one of the first through third shielding layer 141, 142, or 143, or may include at least one of the first and second shielding layers 141 or 142. Hereinafter, for convenience of explanation, a case where the shielding layer 140 includes all of the first through fourth shielding layers 141, 142, 143, and 144 will be described.

The first shielding layer 141 may be disposed on a lower surface of the first base layer 110, the second shielding layer 142 may be disposed on an upper surface of the first base layer 110 facing the first inorganic barrier layer 131, the third shielding layer 143 may be disposed on a lower surface of the second base layer 120 facing the first inorganic barrier layer 131, and the fourth shielding layer 144 may be disposed on an upper surface of the second base layer 120.

The shielding layer 140 may cover/overlap only a portion of the display device 10. For example, the first through fourth shielding layers 141, 142, 143, and 144 having certain areas may be located to face the first TFT T1. The shielding layer 140 may prevent degradation of the quality of an image provided by the display device 10, by protecting the pixel circuit from an electrostatic discharge generated during the manufacture of the display device 10 or after the completion thereof.

Figure 5:
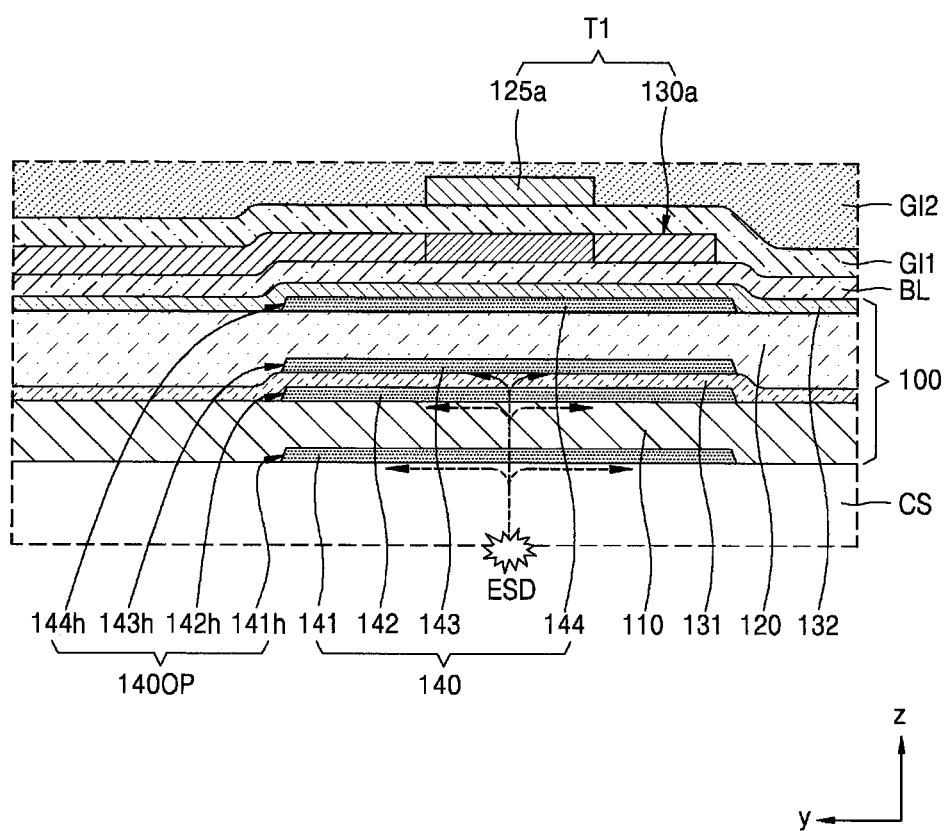
FIG. 5 is a cross-sectional view during a process of manufacturing a display device, according to some exemplary embodiments.
Figure 6:
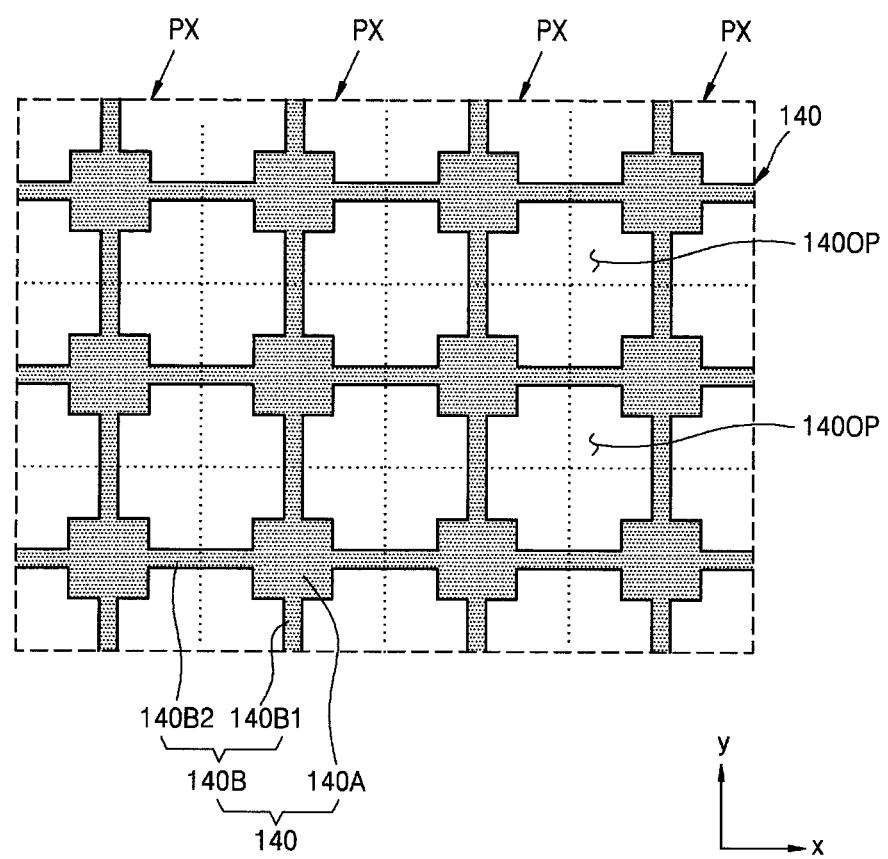
FIG. 6 is a plan view of a shielding layer extracted from the display device according to some exemplary embodiments.

FIG. 5 is a cross-sectional view during a process of manufacturing a display device, according to an embodiment, and FIG. 6 is a plan view of a shielding layer extracted from the display device according to an embodiment. A dashed line in FIG. 5 indicates movement of an electrostatic discharge (ESD), and FIG. 6 illustrates a display area on which 4×3 pixels PX are disposed.

As shown in FIG. 5, the shielding layer 140 may include at least one of the first through fourth shielding layers 141, 142, 143, or 144 disposed on at least one base layer and/or at least one inorganic barrier layer included in the substrate 100. As shown in FIG. 6, the shielding layer 140 may be located on a region corresponding to a portion of the display device 10, and may include first and second portions 140A and 140B having certain areas and openings 140OP adjacent to the first and second portions 140A and 140B. Each of the first portions 140A may correspond to the first TFT T1 of each pixel PX, and neighboring first portions 140A may be connected to each other by a second portion 140B. In an embodiment, the first portions 140A may be connected to each other in a y direction by first sub-portions 140B1 and may be connected to each other in an x direction intersecting with the y direction by second sub-portions 140B2, and thus the shielding layer 140 may have a net (or lattice) pattern, and the openings 140OP may be spaced apart from each other while being surrounded by the first and second portions 140A and 140B.

During the manufacture of the display device 10, the substrate 100 is disposed on a carrier substrate CS, such as glass, and is then moved, as shown in FIG. 5, and the pixel circuit including the TFTs and the storage capacitor described above with reference to FIG. 3 and the display device may be formed on the substrate 100 while the carrier substrate CS is moving. The carrier substrate CS may be removed after the display device is formed. During the manufacturing process, the carrier substrate CS may be transferred by a roller (not shown) or the like. At this time, the ESD may be generated due to friction between the roller and the carrier substrate CS.

If the ESD may be introduced via the substrate 100, the pixel circuit may be damaged by the ESD and thus the quality of an image realized by the display device 10 may degrade. For example, when the ESD is introduced into the semiconductor layer (for example, a driving semiconductor layer), a problem, such as a stain being visually recognized due to an increase in a hole trap in a channel region, may be caused. However, according to an embodiment of the present invention, because the shielding layer 140 is included in the substrate 100, damage to the pixel circuit (for example, the first TFT T1) due to the ESD may be prevented, and thus the above-described problem may be prevented or minimized.

The first through fourth shielding layers 141, 142, 143, and 144 may include amorphous silicon doped with P-type or N-type impurities or hydrogenated amorphous silicon. The first through fourth shielding layers 141, 142, 143, and 144 including the above-described material may not only shield an electrostatic discharge but also enhance adhesiveness between neighboring layers. For example, the second through fourth shielding layer 142, 143, and 144 may enhance adhesiveness between the first and second base layers 110 and 120 and the first and second inorganic barrier layer 131 and 132. According to another embodiment, the first through fourth shielding layers 141, 142, 143, and 144 may include a transparent conductive material such as ITO, IZO, ZnO, In$_2$O$_3$, IGO, or AZO.

The first through fourth shielding layers 141, 142, 143, and 144 may respectively include openings 141h, 142h, 143h, and 144h corresponding to the openings 140OP of the shielding layer 140. The first base layer 110 and the first inorganic barrier layer 131 may directly contact each other via the opening 142h of the second shielding layer 142, and the first inorganic barrier layer 131 and the second base layer 120 may directly contact each other via the opening 143h of the third shielding layer 143. The second base layer 120 and the second inorganic barrier layer 132 may directly contact each other via the opening 144h of the fourth shielding layer 144.

Although the second inorganic barrier layer 132 is included in an uppermost layer of the substrate 100 in FIG. 5, embodiments are not limited thereto. According to another embodiment, the second inorganic barrier layer 132 may be omitted. In this case, the second base layer 120 may directly contact the buffer layer BL via the opening 144h of the fourth shielding layer 144.

When the shielding layer 140 includes the first and second portions 140A and 140B having certain areas to face respective portions of pixel circuits, and the openings 140OP adjacent to the first and second portions 140A and 140B, as shown in FIG. 6, the shielding layer 140 may easily control a discharge path of the ESD such that the ESD may be easily propagated and discharged according to a pattern of the shielding layer 140, compared with a case where a shielding layer has substantially the same area as the area of the substrate 100 or as the area of the display area DA (FIG. 1).

Although generation of the ESD during the manufacture of the display device 10 has been described above, the ESD may be generated after the display device 10 is completed. For example, the ESD may be generated while an electronic device using the display device 10 is being assembled. In this case, the shielding layer 140 may prevent the display device 10 from being damaged due to the electrostatic discharge ESD.

In FIG. 6, the shielding layer 140 has a lattice structure in which the first portions 140A are connected to each other in the x direction by the first sub-portions 140B1 and are connected to each other in the y direction intersecting with the x direction by the second sub-portions 140B2, and the openings 140OP are spaced apart from each other. However, embodiments are not limited thereto.

Figure 7:
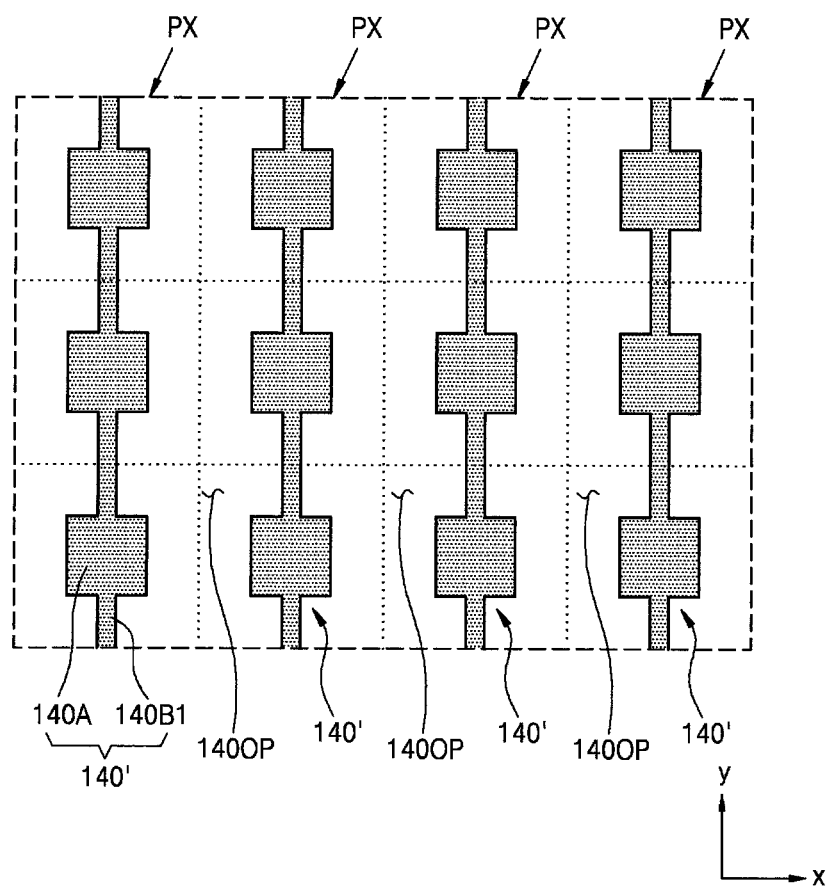
FIG. 7 is a plan view of a display area in a display device according to some exemplary embodiments.
Figure 8:
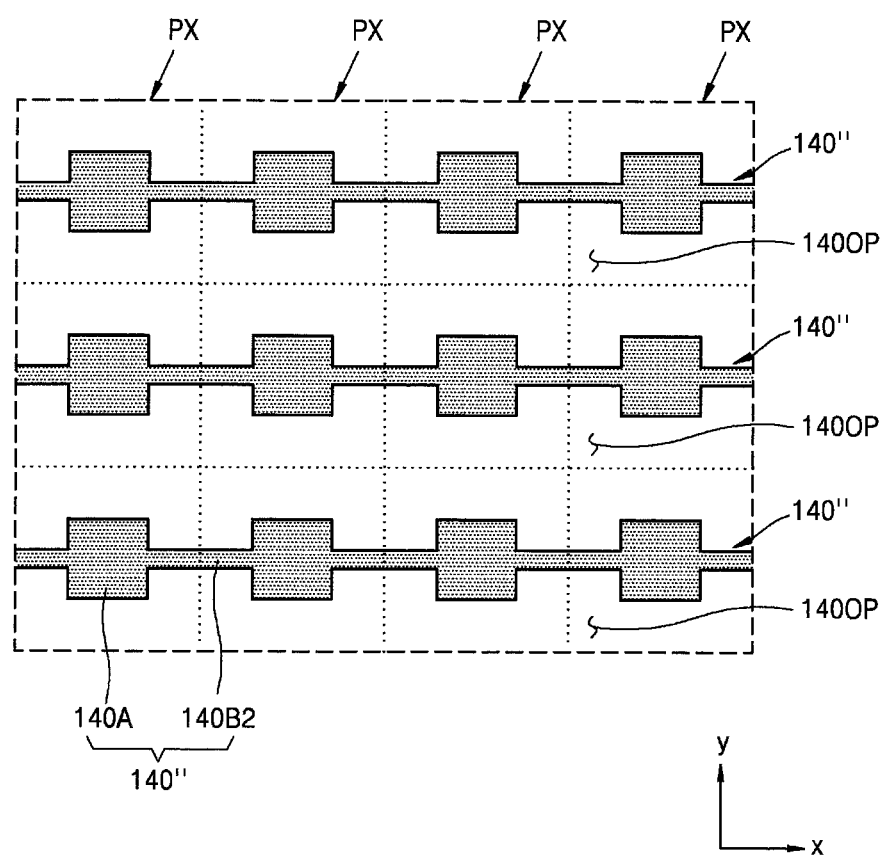
FIG. 8 is a plan view of a display area in a display device according to some exemplary embodiments.

FIGS. 7 and 8 are plan views of display areas in display devices according to other embodiments.

Although shielding layers 140' and 140" of FIGS. 7 and 8 have different planar structures from the shielding layer 140, the shielding layers 140' and 140" have the same stacking structures as the shielding layer 140 because they include at least one of the first through fourth shielding layers 141, 142, 143, or 144. Thus, a difference between each of the shielding layers 140' and 140" and the shielding layer 140 will now be focused.

Referring to FIG. 7, the shielding layer 140' may include the first portions 140A, but may have an approximate stripe pattern in which the first portions 140A are connected to each other by second portions each extending in they direction, for example, by the first sub-portions 140B1. Accordingly, the openings 140OP may have a stripe pattern. Each of the openings 140OP may extend in the y direction.

Referring to FIG. 8, the shielding layer 140" may include the first portions 140A, but may have an approximate stripe pattern in which the first portions 140A are connected to each other by second portions each extending in the x direction, for example, by the second sub-portions 140B2. Accordingly, the openings 140OP may have a stripe pattern. Each of the openings 140OP may extend in the x direction.

Figure 9:
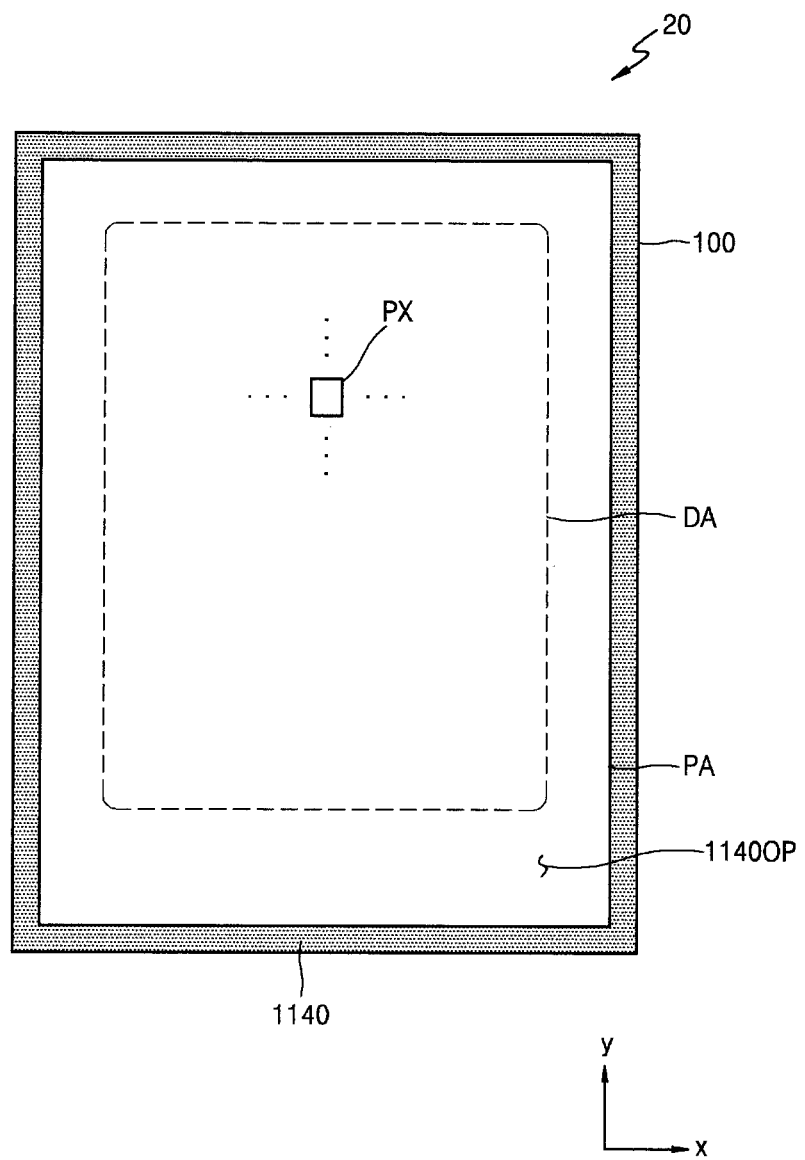
FIG. 9 is a schematic plan view of a display device according to some exemplary embodiments.
Figure 10:
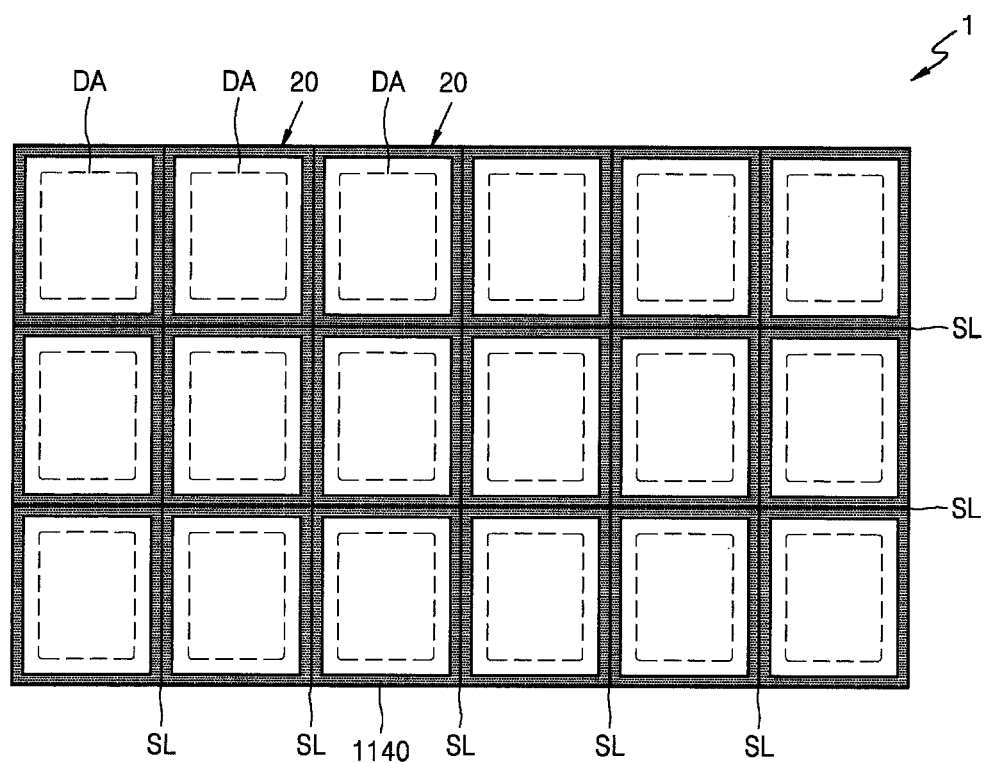
FIG. 10 is a schematic plan view of a mother substrate including the display device of FIG. 9.

FIG. 9 is a schematic plan view of a display device 20 according to another embodiment, and FIG. 10 is a schematic plan view of a mother substrate 1 including display devices 20 of FIG. 9.

Referring to FIG. 9, the display device 20 is the same as the above-described display device 10 in that the display device 20 includes a display area DA including pixels PX and a peripheral area PA around the display area DA and each pixel PX includes a pixel circuit including TFTs and a storage capacitor and a display device connected to the pixel circuit. Thus, a difference between the display devices 10 and 20 will now be described.

A substrate 100 of the display device 20 includes a shielding layer 1140, and the shielding layer 1140 may correspond to the peripheral area PA instead of the display area DA. For example, as shown in FIG. 9, the shielding layer 1140 may have a ring pattern by extending along an edge of the peripheral area PA such as to surround the display area DA, and an area corresponding to the display area DA corresponds to an opening 1140OP.

The shielding layer 1140 may include at least one of the first through fourth shielding layers 141, 142, 143, or 144 as described above with reference to FIGS. 4 and 5. The shielding layer 1140 may include the semiconductor material and/or transparent conductive material as described above.

Referring to FIG. 10, after forming elements of the display device 20 in a state of the mother substrate 1, the mother substrate 1 may be cut along cutting lines SL by using a laser cutter, a blade, or the like, and thus each display device 20 may be formed.

The ESD, which may be generated while the elements of the display device 20 are being formed, may propagate and be discharged through a pattern of the shielding layer 1140.

Although the display device 20 of FIG. 9 has a structure in which the shielding layer 1140 surrounds the display area DA along the peripheral area PA, embodiments are not limited thereto. According to another embodiment, according to where the cutting lines SL are disposed in the mother substrate 1, the shielding layer 1140 of the display device 20 may partially surround the display area DA.

Figure 11:
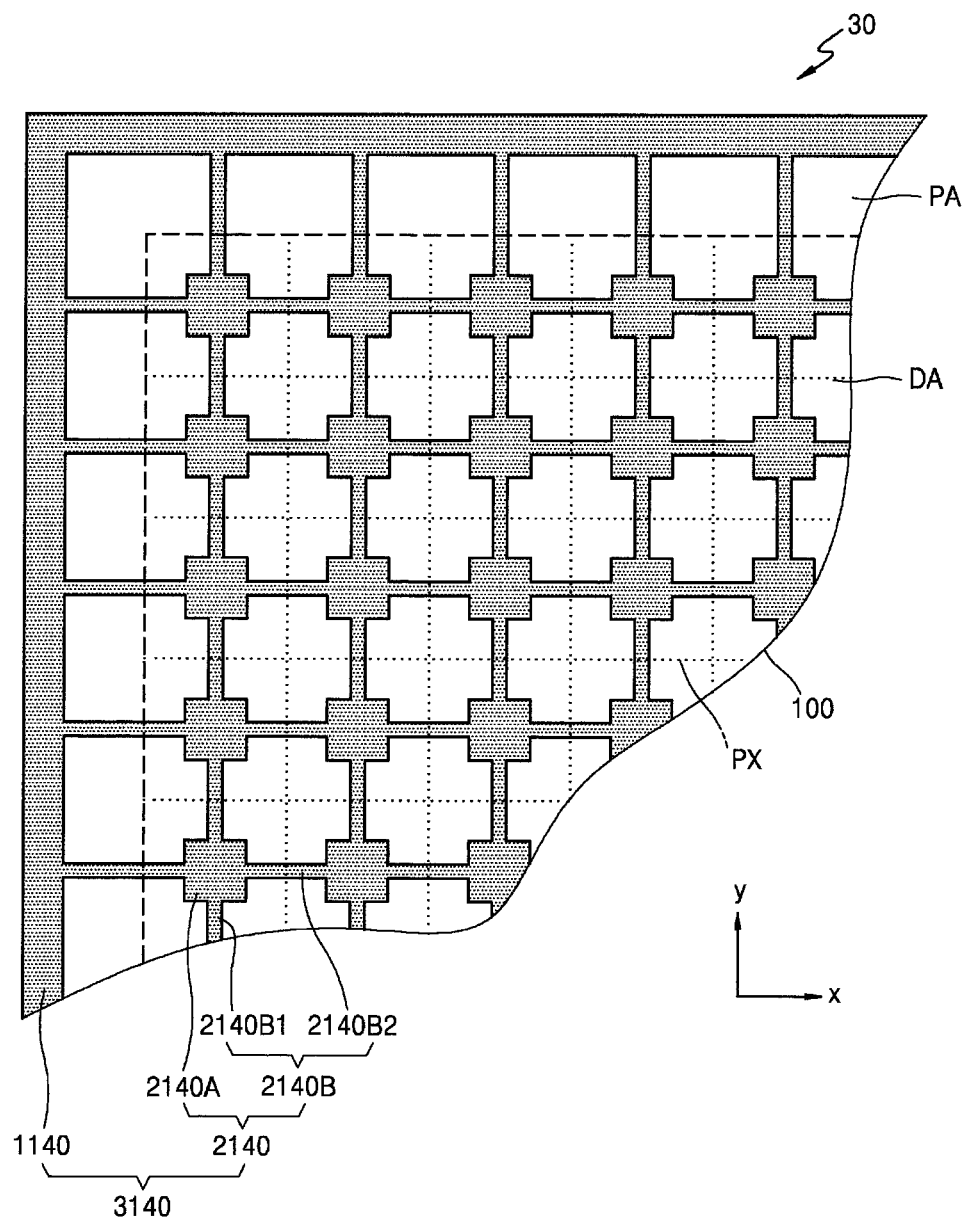
FIG. 11 is a plan view of a portion of a display device according to some exemplary embodiments.

FIG. 11 is a plan view of a portion of a display device 30 according to another embodiment.

Referring to FIG. 11, the display device 30 includes a display area DA including pixels PX and a peripheral area PA around the display area DA. Each pixel PX of the display device 30 includes a pixel circuit including TFTs and a storage capacitor, and a display element connected to the pixel circuit, as described above. Hereinafter, for convenience of explanation, differences between the display devices 10 and 30 will be described.

Referring to FIG. 11, a substrate 100 may include a shielding layer 3140, wherein the shielding layer 3140 may include a portion 1140 located in the peripheral area PA and a portion 2140 located in the display area DA and the portions 1140 and 2140 may be connected to each other.

The portion 1140 of the shielding layer 3140 that corresponds to the peripheral area PA may surround at least a portion of the display area DA.

The portion 2140 of the shielding layer 3140, which corresponds to the display area DA, includes first portions 2140A corresponding to portions of respective pixel circuits of the pixel PX and second portions 2140B connecting the first portions 2140A to each other. The second portions 2140B includes first sub-portions 2140B1 and second sub-portions 2140B2 respectively extending in the y direction and the x direction.

The portion 1140 corresponding to the peripheral area PA and the portion 2140 corresponding to the display area DA may be connected to each other.

Accordingly, an electrostatic discharge may be relatively easily propagated and discharged through a pattern of the shielding layer 3140.

The shielding layer 3140 includes at least one of the first through fourth shielding layers 141, 142, 143, or 144 of FIG. 5. The shielding layer 3140 includes a semiconductor material and/or a transparent conductive material as describe above.

Figure 12:
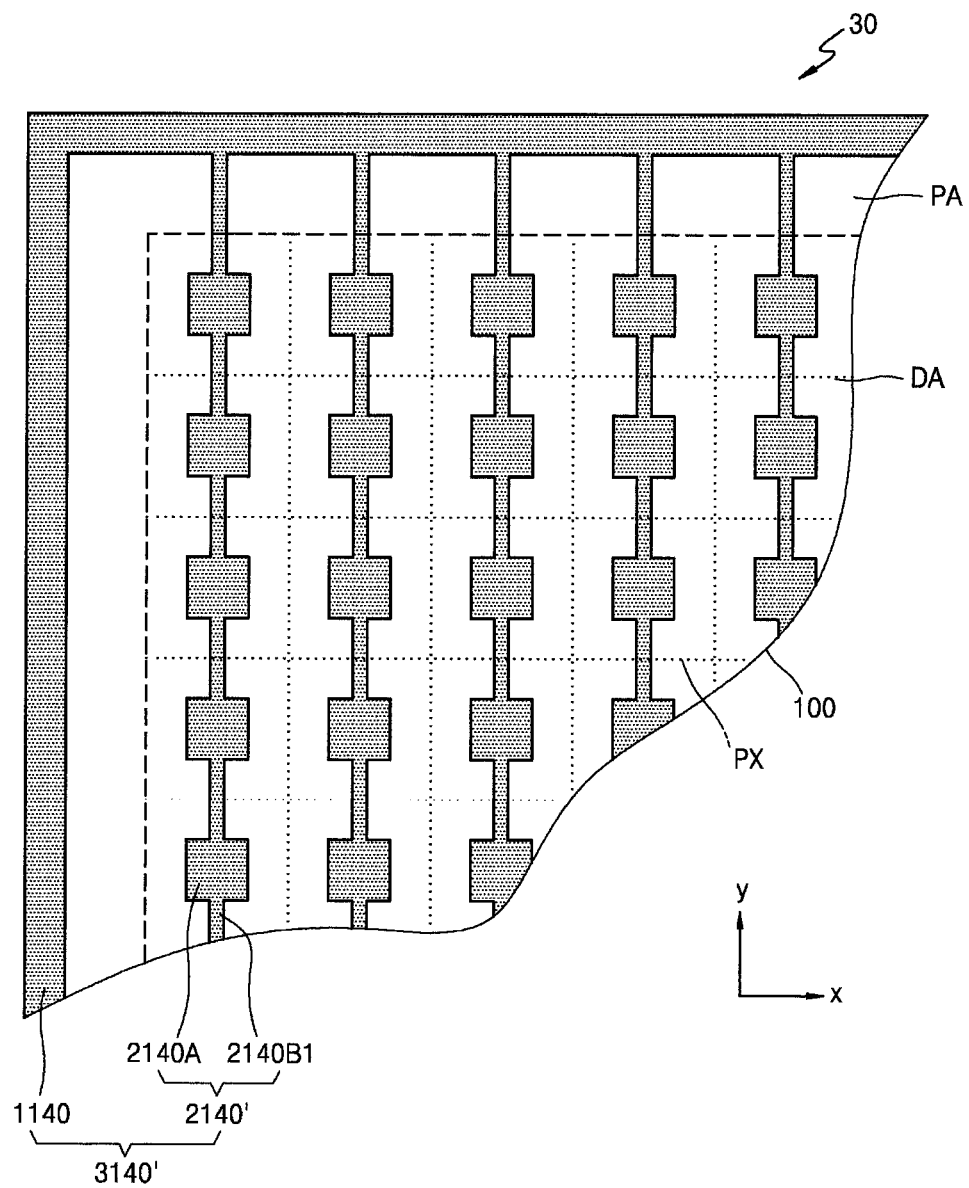
FIG. 12 is a plan view of a portion of a display device according to some exemplary embodiments.
Figure 13:
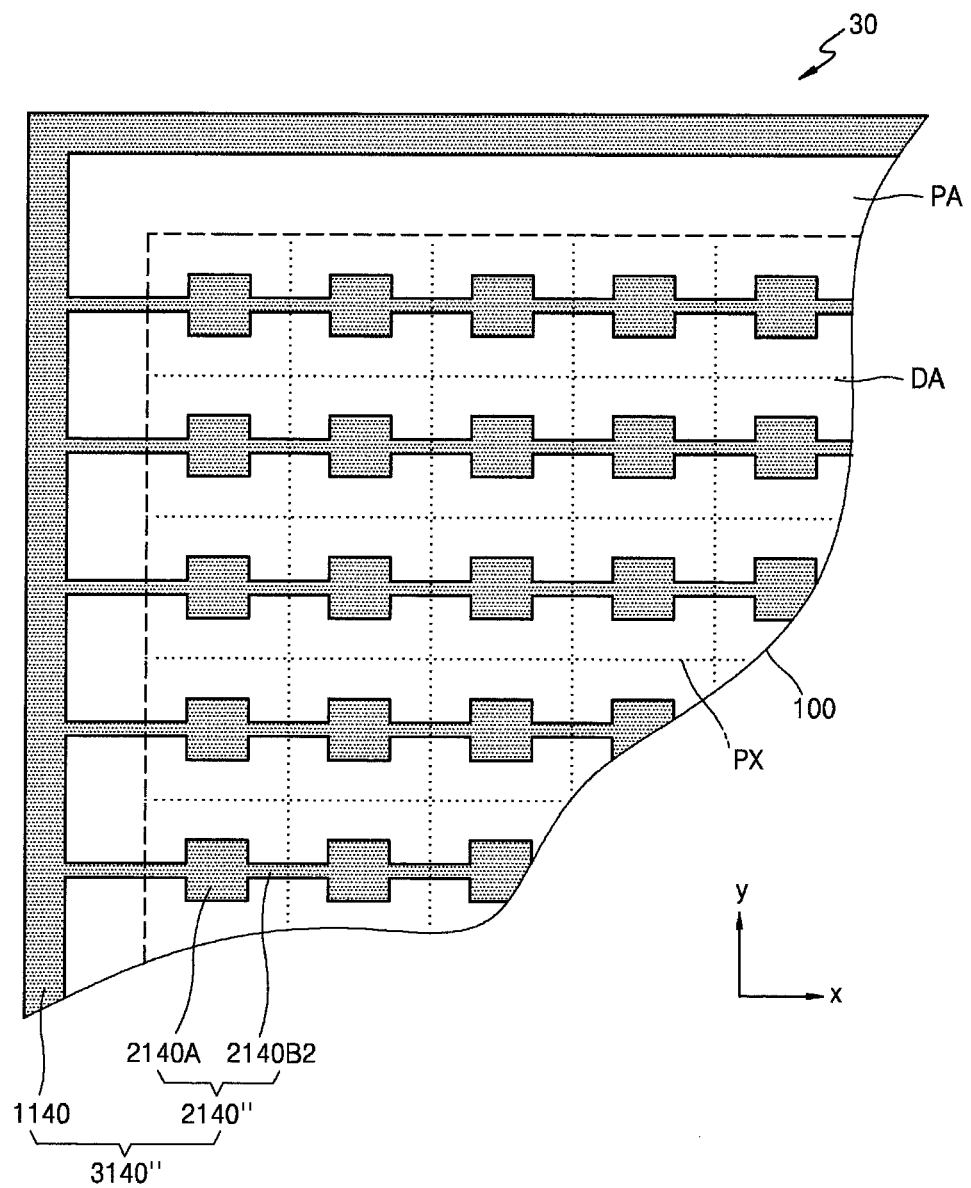
FIG. 13 is a plan view of a portion of a display device according to some exemplary embodiments.

FIGS. 12 and 13 are plan views of portions of display devices 30 according to other embodiments.

Shielding layers 3140' and 3140" included in substrates 100 of the display devices 30 of FIGS. 12 and 13 have different planar structures, namely, different patterns, from the shielding layer 3140 of FIG. 11. Hereinafter, for convenience of explanation, differences will be described, and some repetitive description may be omitted.

Referring to FIG. 12, a portion 2140' of the shielding layer 3140' that corresponds to a display area DA includes first portions 2140A corresponding to portions of respective pixel circuits of pixels PX and first sub-portions 2140B1 connecting the first portions 2140A to each other and extending in the y direction. Accordingly, as described above with reference to FIG. 7, the portions 2140' corresponding to the display area DA may substantially have a stripe pattern.

The portion 2140' corresponding to the display area DA may be connected to the portion 1140 corresponding to a peripheral area PA such that an electrostatic discharge may be easily propagated and discharged through a pattern of the shielding layer 3140'. Moreover, as described above, the shielding layer 3140' may include at least one of the first through fourth shielding layers 141, 142, 143, or 144 of FIG. 5. The shielding layer 3140' may include a semiconductor material and/or a transparent conductive material, as described above.

Referring to FIG. 13, a portion 2140" of the shielding layer 3140" that corresponds to a display area DA includes first portions 2140A corresponding to portions of respective pixel circuits of pixels PX and second sub-portions 2140B2 connecting the first portions 2140A to each other and extending in the x direction. Accordingly, as described above with reference to FIG. 8, the portion 2140" corresponding to the display area DA may have a stripe pattern.

The portion 2140" corresponding to the display area DA may be connected to the portion 1140 corresponding to a peripheral area PA such that an electrostatic discharge may be easily propagated and discharged through a pattern of the shielding layer 3140". Moreover, as described above, the shielding layer 3140" may include at least one of the first through fourth shielding layers 141, 142, 143, or 144 of FIG. 5. The shielding layer 3140" may include a semiconductor material and/or a transparent conductive material, as described above.

Display devices according to embodiments of the present invention may provide high-quality images by effectively preventing the display devices from being damaged due to an electrostatic discharge.

While aspects of the inventive concept has been shown and described with reference to exemplary embodiments thereof, it will be understood by those of ordinary skill in the art that various changes in form and details may be made therein without departing from the spirit and scope as defined by the following claims, and their equivalents.

What is claimed is:
1. A display device comprising:
a flexible substrate;
a buffer layer on the flexible substrate and including an inorganic material;
a display area including a plurality of pixels, wherein each pixel includes a pixel circuit on the buffer layer and a display element electrically connected to the pixel circuit, and the pixel circuit includes a first thin film transistor (TFT), a second TFT, and a storage capacitor; and
a non-display area adjacent to the display area,
wherein the flexible substrate comprises:
at least one base layer;
at least one inorganic barrier layer; and
a shielding layer including a portion having a certain area and an opening adjacent to the portion.
2. The display device of claim 1, wherein
the portion of the shielding layer overlaps the first TFT, and
the opening of the shielding layer overlaps the second TFT.
3. The display device of claim 1, wherein
the portion of the shielding layer corresponds to the non-display area, and
the opening of the shielding layer corresponds to the display area.
4. The display device of claim 1, wherein the at least one base layer and the at least one inorganic barrier layer directly contact each other via the opening of the shielding layer.
5. The display device of claim 1, wherein the flexible substrate comprises:
a first base layer;
a second base layer on the first base layer;
an inorganic barrier layer between the first base layer and the second base layer; and
the shielding layer.
6. The display device of claim 5, wherein
the first base layer comprises an upper surface that faces the inorganic barrier layer, and a lower surface opposite to the upper surface, and
the shielding layer is on at least one of the upper surface or the lower surface of the first base layer.
7. The display device of claim 6, wherein
the shielding layer is between the first base layer and the inorganic barrier layer, and
the inorganic barrier layer and the first base layer directly contact each other via the opening of the shielding layer.
8. The display device of claim 5, wherein
the second base layer comprises a lower surface that faces the inorganic barrier layer, and an upper surface opposite to the lower surface, and
the shielding layer is on at least one of the upper surface or the lower surface of the second base layer.
9. The display device of claim 8, wherein
the shielding layer is between the second base layer and the inorganic barrier layer, and
the inorganic barrier layer and the second base layer directly contact each other via the opening of the shielding layer.
10. The display device of claim 1, wherein the shielding layer comprises amorphous silicon doped with P-type or N-type impurity or hydrogenated amorphous silicon.
11. The display device of claim 1, wherein the shielding layer comprises a transparent conductive material.
12. A display device comprising:
a flexible substrate;
a buffer layer on the flexible substrate and including an inorganic material; and
a plurality of pixels on the buffer layer, wherein each pixel comprises a pixel circuit including a first thin film transistor (TFT), a second TFT, and a storage capacitor and a display element electrically connected to the pixel circuit,
wherein the flexible substrate comprises:
at least one base layer;
at least one inorganic barrier layer; and
a shielding layer, wherein the shielding layer includes a portion corresponding to the first TFT and having a certain area, and an opening adjacent to the portion.
13. The display device of claim 12, wherein the opening of the shielding layer corresponds to the second TFT.
14. The display device of claim 12, wherein the storage capacitor overlaps the first TFT and a portion of the shielding layer.

15. The display device of claim 12, wherein the at least one base layer and the at least one inorganic barrier layer directly contact each other via the opening of the shielding layer.

16. The display device of claim 12, wherein the shielding layer comprises a semiconductor material or a transparent conductive material.

17. The display device of claim 12, wherein the portion of the shielding layer comprises:
   first portions that cover respective first TFTs of the plurality of pixels; and
   second portions that connect the first portions to each other.

18. The display device of claim 17, wherein
   the second portions each extend in a first direction and connect the first portions to each other, and
   the opening of the shielding layer has a stripe pattern extending in the first direction.

19. The display device of claim 17, wherein
   the second portions each extend in a first direction and a second direction intersecting with the first direction and connect the first portions to each other, and
   the shielding layer has a net pattern in which the opening is surrounded by the first and second portions.

20. The display device of claim 17, wherein the shielding layer further comprises an additional shielding portion corresponding to an outer area of the flexible substrate such as to at least partially surround the plurality of pixels.

* * * * *